(12) United States Patent
Forlenza et al.

(10) Patent No.: US 6,308,290 B1
(45) Date of Patent: Oct. 23, 2001

(54) LOOK AHEAD SCAN CHAIN DIAGNOSTIC METHOD

(75) Inventors: Orazio P. Forlenza; Mary P. Kusko; Franco Motika, all of Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/315,461

(22) Filed: May 20, 1999

(51) Int. Cl.$^7$ ...................................................... G06F 11/00
(52) U.S. Cl. ............................................ 714/724; 714/733
(58) Field of Search .................................... 714/724, 738, 714/728, 733, 734, 726

(56) References Cited

U.S. PATENT DOCUMENTS

| | | | |
|---|---|---|---|
| 3,761,695 | 9/1973 | Eichelberger | 235/153 |
| 4,947,357 | 8/1990 | Stewart et al. | 371/22.3 |
| 5,155,732 | 10/1992 | Jarwala et al. | 371/22.3 |
| 5,764,655 | 6/1998 | Kirihata et al. | 371/22.5 |

OTHER PUBLICATIONS

Edirisooriya et al., "Diagnosis of Scan Path Failures," IEEE, 2/95, pp. 250–255.
Eichelberger et al., "A Logic Design Structure for LSI Testability," Proceedings of the 14th Design Automation Conference, New Orleans, 1977, pp. 462–468.
Kundu, Sandip, "Diagnosing Scan Chain Faults," IEEE Transactions on Very Large Integration (VLSI) Systems, vol. 2, No. 4, 12/94, pp. 512–516.
Narayanan et al., "An Efficient Scheme to Diagnose Scan Chains," IEEE, International Test Conference, Paper 29–3, 07/97 pp. 704–713.
Schafer et al., "Partner SRLS for Improved Shift Register Diagnostics," IEEE VLSI Test Symposium, Paper 9.3, 6/92, 198–201.
Vallett, David P., "IC Failure Analysis: The Importance of Test and Diagnostics," IEEE Design & Test of Computers, 7–9/97, pp. 76–82.

Primary Examiner—Phung M. Chung
(74) Attorney, Agent, or Firm—Lynn L. Augspurger

(57) ABSTRACT

Look ahead testing process diagnoses broken or stuck-at scan chains to a failing shift register latch for improving the final manufacturing process and suggesting potentials for design change prior to manufacturing in order to improve yield levels. Post test data collection, analysis, and diagnosis can be eliminated.

6 Claims, 5 Drawing Sheets

LOOK AHEAD SCAN CHAIN DIAGNOSTIC METHOD

FIELD OF THE INVENTION

This invention relates to a method for testing and diagnosing broken or stuck-at scan chains to a failing Shift Register Latch (SRL).

TRADEMARKS

S/390 and IBM are registered trademarks of International Business Machines Corporation, Armonk, N.Y., U.S.A.

BACKGROUND

Logic level testing of a system at IBM during development of the final manufacturing process of integrated circuits used in the mainframe activities of the company now sold as S/ 390 system has been researched since the 1970's, see for instance, E. B. Eichelberger, "Method of Level Sensitive Testing a Functional Logic System," U.S. Pat. No. 3,761,695, Sep. 25, 1973,and E. B. Eichelberger and T. W. Williams, "A Logic Design Structure for LSI Testability," Proceedings of the 14th Design Automation Conference, New Orleans, 1977, pp. 462–468. See also U.S. Pat. No. 5,764,655: "Built in Self Test with Memory," granted Jun. 9, 1998, as discussed below.

Historically, scan chain fails have been difficult to diagnose. There are some applications which are useful in this area, but they have a low success rate and typically require additional data collection at the tester along with requiring the generation of additional patterns. All this additional work takes time and involves additional tester resources which are also expensive.

However, we know of no successful look ahead method for testing and diagnosing broken or stuck-at scan chains to a failing Shift Register Latch (SRL). This problem is usually encountered early in the life cycle for new chip technology development for improving the process so that manufacturing yield levels are quickly achieved. An inability to improve the technology and yield the device can greatly impact a program or at least severely minimize the revenue that could be realized in a given product life cycle. So, improvement of the technology development life cycle with a method for rapid diagnosis to a location for Physical Failure Analysis (PFA) is needed to understand and correct the process anomalies as is achieved by our method described below.

SUMMARY OF THE INVENTION

This invention provides a method for look ahead testing and diagnosing broken or stuck-at scan chains to a failing Shift Register Latch (SRL for improving the process so manufacturing yield levels are quickly achieved. We have provided an integrated test and diagnostic look ahead scan chain solution that eliminates post-test data collection, analysis, and diagnostics.

DESCRIPTION OF THE DRAWINGS

The two shift registers (long rectangles) represent the same scan chain. The chain on the left is depicted from the same or scan in perspective while the chain on the right is shown from the measure or scan out perspective. The "x" represents the break in the chain.

The following symbols are used in the FIGURES.

N=length of the scan chain

RSL=Representative Stim Latch

RML=Representative Measure Latch.

SRSL=Register that can be stimmed in a defective chip.

ORML=Register that can be observed in a defective chip.

Figure 2:
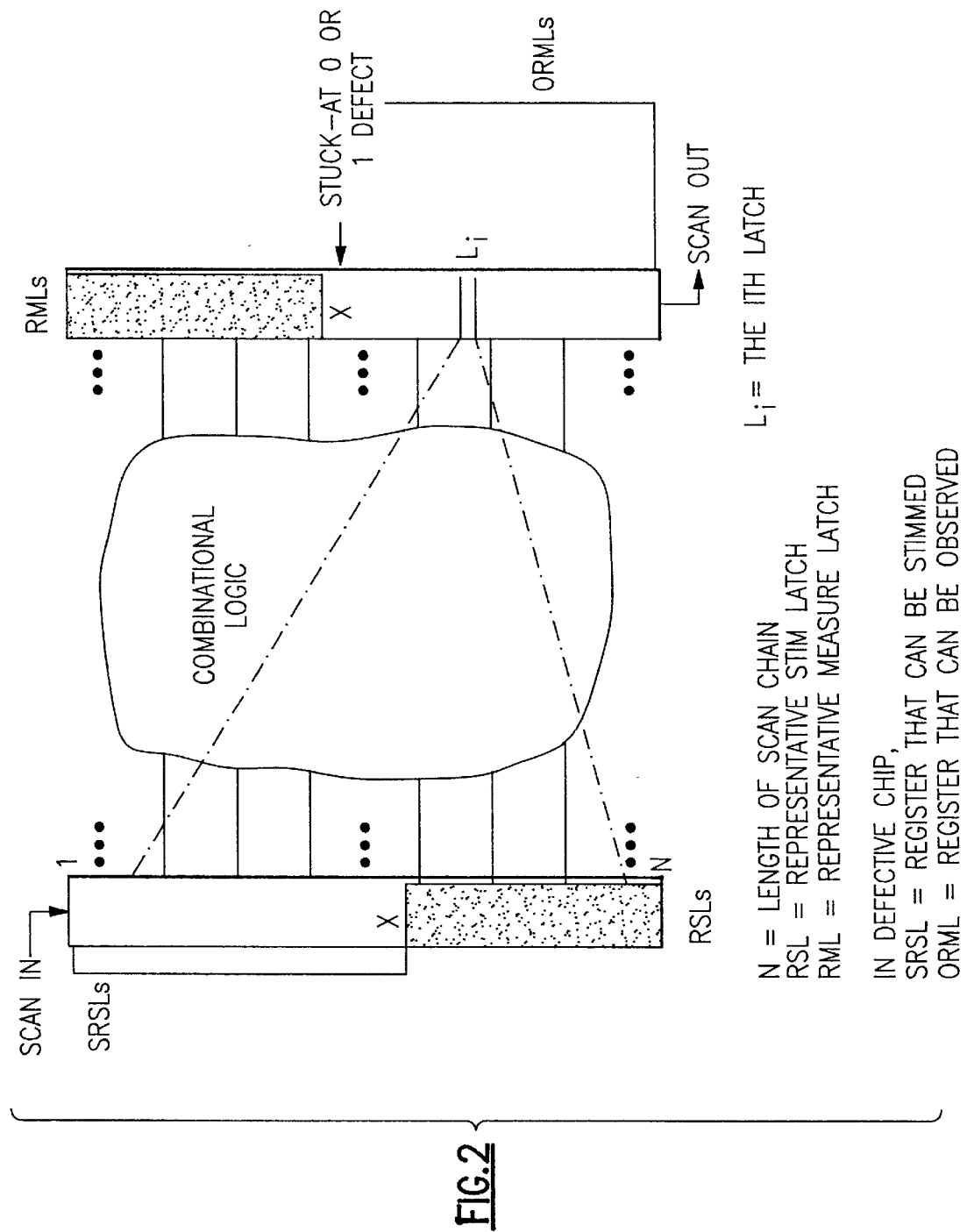
FIG. 2 illustrates scan diagnostics latch targeting.

In the FIGURES, x represents the location of a break in the chain. $L_1$ in the FIG. 2 is the ith latch.

DETAILED DESCRIPTION OF THE INVENTION

After reviewing the following detailed disclosure, it will be appreciated that the method we describe results in the desired technology development by immediate defect localization for PFA. Patterns are used which are generated and ready ahead of chip test. We provide an ability to select a quality subset of the failing chips. The result provides a faster debug due to these processes. Our method accomplishes an automated process requiring fewer test resources, i.e., test engineers, ATE time, and the minimization of fail data collection.

First, however, it should be understood in the environment we are discussing, that in a scan-based design, the latches are accessible, in the preferred embodiment described, via serial access. This scan control can be implemented in several forms, a common implementation being LSSD [1–2]. LSSD latches are typically implemented in a L1/L2 configuration where the L1 or master latch has two data ports and may be updated by either a scan clock or a functional clock. The L2 or slave latch has only one clock input and that clock is out of phase with both L1 clocks. Scanning is done using separate A and B clocks.

In a typical low or zero yield situation, the most common failure is often the scan chain. Albeit, the design must be a scan-based design, but this is very common, and scan chains represent a significant portion of the real estate area. Having a solution which speeds diagnostics on the majority of failing chips ultimately results in timely yield improvements thereby ensuring successful production of the design.

The approach here is somewhat different from classic diagnostic methodologies where diagnostics are performed after the technology process is mature, and which is an off-line process on specific failing chips and frequently involves the creation of new patterns. In this approach we design or generate the test prior to first wafers and then select a subset of highly diagnosable failing chips. Since most devices use a scan-based design using LSSD or some other scan technique, there is a natural common subset of chips which fail as a result of a broken chain.

Scan chains represent a significant portion of the chip, including critical area. Our approach of being able to select among the failing chips provides for a quality set of chips for diagnostics and PFA. The following discussion will concentrate on an approach which enables quick diagnosis of most of the failing chips ultimately resulting in yield improvements.

Figure 1:
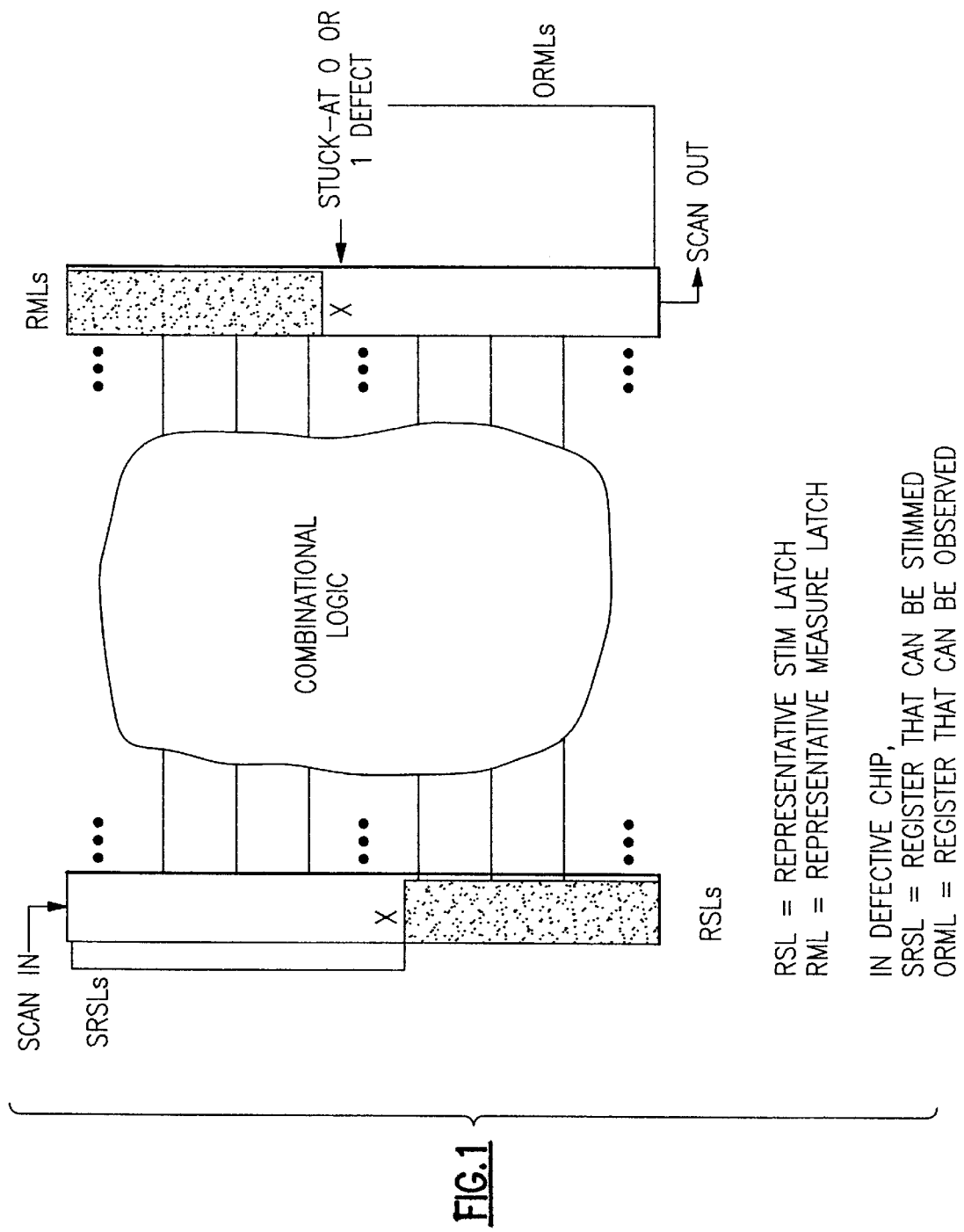
FIG. 1 illustrates the broken scan chain configuration.

The broken scan chain configuration is illustrated in FIG. 1. In FIG. 1 two shift registers are represented by the long rectangles, and they are shown as being in and representing the same scan chain being connected to one another via combinatorial logic. The scan of the left is depicted from the representative Stim Latch (RSL) or scan in perspective, while the chain on the right is shown from the representative Measure Latch (RML) or scan out perspective. As shown, in each chain there is a break in the chain represented by the "x".

Below, we set forth a list of the assumed types of DC scan chain fails and assumptions made. Our diagnostic method addresses a subset of these DC scan chain fails.

Type of DC Scan Chain Fails:
1) stuck-at-0 chain
2) stuck-at-1 chain
3) scan clock fails
4) hot system clock
5) shorted chain
6) multiple faults
7) compound faults
8) non-DC faults (these are addressed by a different methodology)

Assumptions:
1) simple fault
2stuck-at-chain (0 or 1)
3) fails classic flush and scan test Note:
1) scan chain inversions are known
2) scan only latches are not updatable by system clocks
3) system clocking exists Implementation The basic concept consists of generating scan chain diagnostic patterns prior to initial testing by using the SRSLs (registers that can be stimmed illustrated by the RSL ahead of the break of the FIGURES) and ORMLs (registers that can be observed illustrated by the registers after the break in the RMLs) in conjunction with system clocks and then applying these patterns conditionally to chips failing the flush and scan test. These patterns are generated in such a manner that they are independent of where the SR chain fails, but are then used to dynamically determine the failing SRL location for defective chips. The chips that cannot be diagnosed to a single latch are not considered for diagnostics or as potential PFA candidates.

Thus, for an overview, our method will comprise a set of steps in diagnosing chip failures so that improvements in yields or design based upon examination of the chip failures can be accomplished. Our process comprises a method for testing and diagnosing broken or stuck-at scan chains in an integrated circuit to locate failed or failing shift registers after application of a predetermined set of test patterns to be used for a set of chips. The overall steps of:

(a) generating a set of diagnostic patterns which will be used to identify a failing SRL for a set of chip design elements that are to be diagnosed;

(b) using said set of diagnostic patterns to diagnose chips that have broken scan chains and to identify specific defective latches by using a set of diagnostic patterns in a predetermined order; and (c) examining the patterns for a determination as to failing SRLs which are identified for each chip being diagnosed will be described in detail. The failing SRL provides a precise location for physical failure analysis.

Thereafter, a physical failure analysis is performed to enable process and design improvements to be made in the technology used during chip manufacturing after understanding the reasons for failures identified during the diagnosis of the chips tested by steps (a) through (c) to make yield improvements to ensure successful production of the chip design with improved yields.

Two sets of patterns are generated, one for a stuck-at 0 chain and another for a stuck-at 1 chain. Patterns are generated per latch or RSL. The pattern is generated such that the target latch is set to the opposite of the respective stuck-at value while all the latches following it in the scan chain are held to the stuck-at value. Note, SRL inversion must be accounted for.

Not all latches will result in a test. The patterns are applied in RSL order, from scan-in to scan-out. Conditionally, the 0 or 1 set of patterns are used. This is not absolutely necessary but improves efficiency. From the failing patterns, the failing RSL or range of functioning RSLs can be determined. Using the fail data from a set of chips, chips that are resolved to a failing SRL can be used for PFA (See FIG. 2).

In accordance with our preferred process, look ahead patterns are generated using the following algorithm.

SFS=scan fail state

Figure 3:
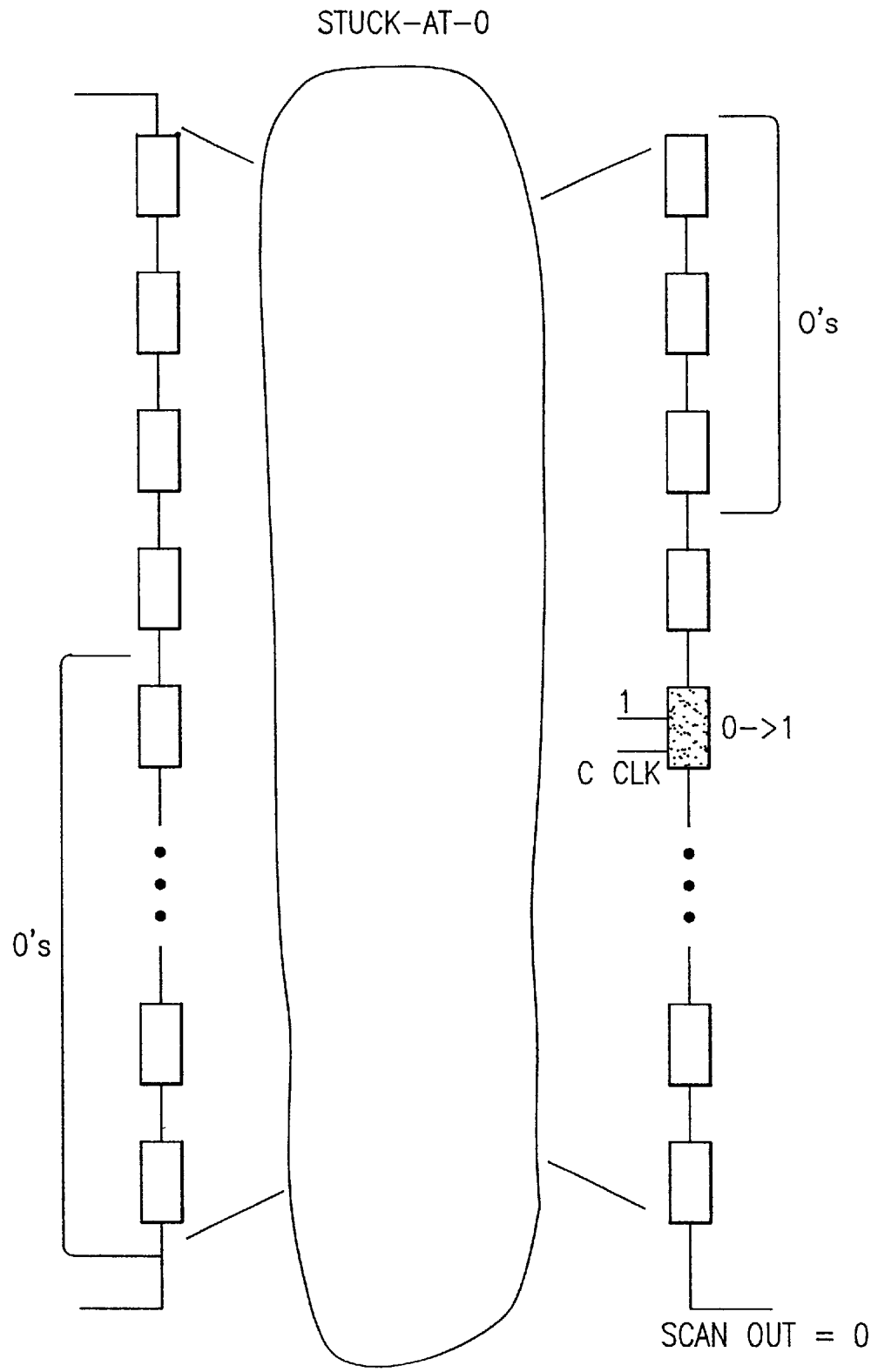
FIG. 3 illustrates scan diagnostics pattern generation for stuck-at zero fails.
Figure 4:
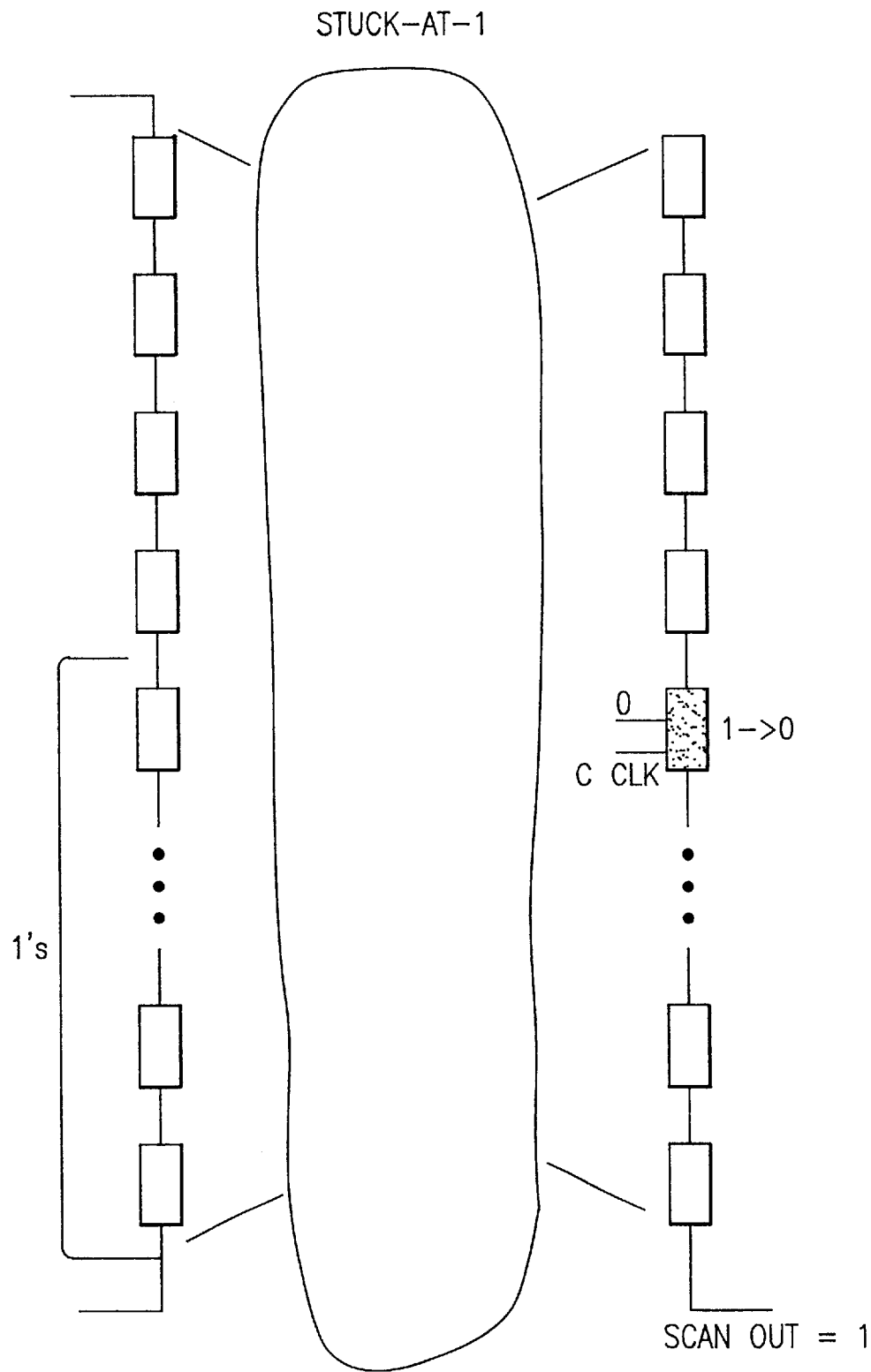
FIG. 4 illustrates scan diagnostics pattern generation for stuck-at one fails.

SFSi=scan fail state for RMLi=RSLi for all non-SRSLs and non-ORMLs then:
for each RMLi i=1 to N generate a deterministic pattern so that SRMLi=$\overline{SFS}$ (–indicates complement )
using PIs and RSL 1, (i-1) [0,1,x] and clocks
while restricting RSL i,N [SFS]
and then measure RMLi for $\overline{SFS}$ Note, both 0 and 1 patterns can be guaranteed for RMLi and applied to the chip. If both pass, then the shift register is functional between 1–Li. One pattern will always pass (See FIG. 3 and FIG. 4).

Figure 5:
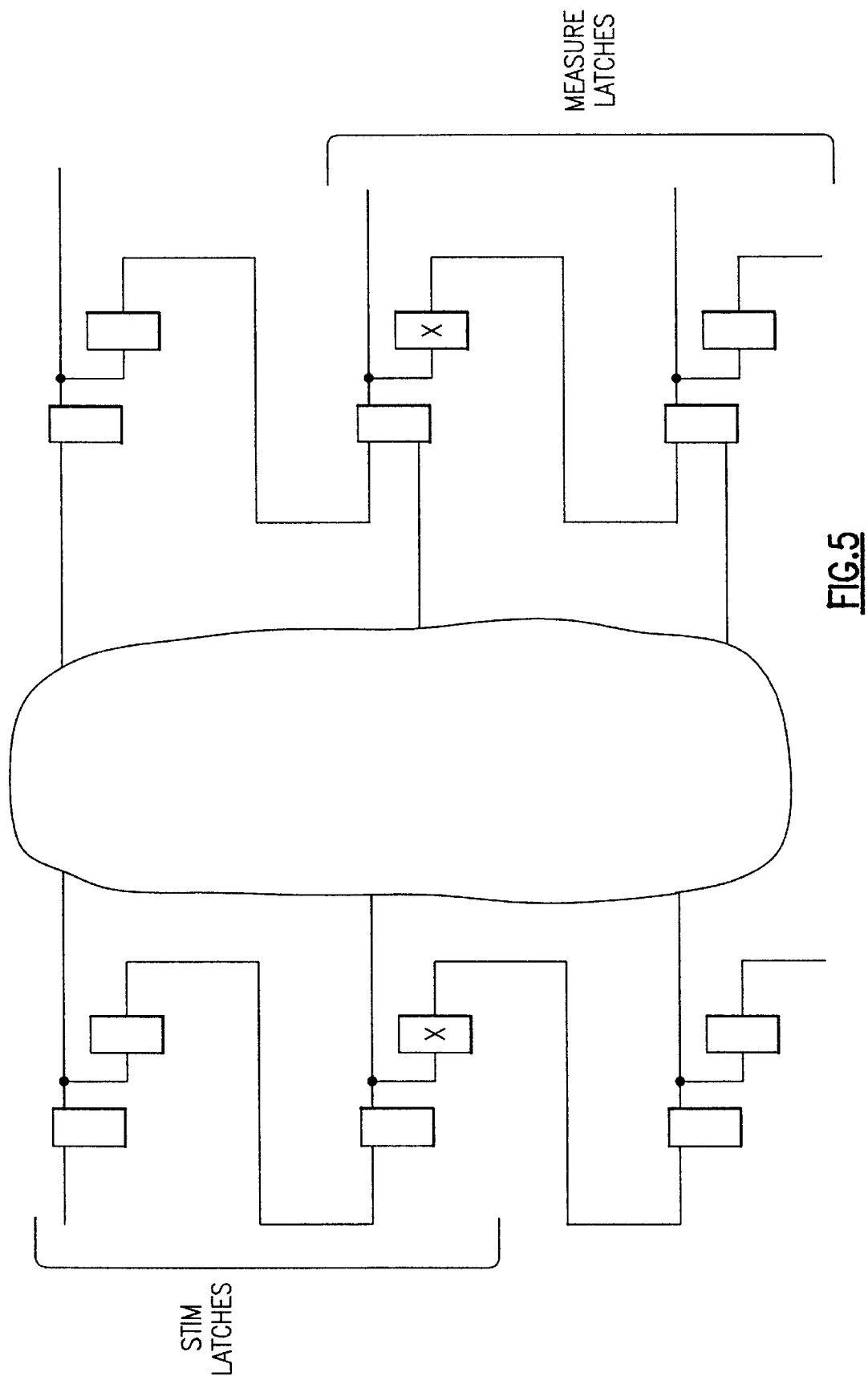
FIG. 5 illustrates L1/L2 expansion.

This technique can be extended for L1/L2 latches as illustrated in FIG. 5. There the testing is used within the latch composition.

The determination of the failing SRL is relatively simple during test execution. First, the pairs of patterns per SRL are ordered in ascending manner (1–N). The patterns are then applied to the device, and the first failing pattern is recorded. If the previous pattern (passing pair of patterns) is for the previous latch, then the 1st failing RML is identified (single latch). If not all patterns were generated for all preceding latches then one must determine the last passing latch for the specific failing condition (0 or 1 scan). This will result in a range of potentially failing latches and reduce the diagnostic resolution.

A criteria can be established to determine the latch range of interest while the rest of the chips can be rejected. Of course, this determination can be done off-line without tying tester resources and the need for conditional testing. The simplest approach practically would be to apply all pair patterns until the 1st fail, record the fail, and skip out.

One can further define a "scan diagnosability coverage" measure that would indicate, for a specific design, the probability of diagnosability (Pd) to a single SRL. This might consist of:

$$P=ng/N$$

where ng is the number of latches able to generate a pattern and N is the total number of latches.

Of course, there would be a Pd0 and Pd1 depending on the stuck-at condition of the scan chain. In other words, there would be two numbers for the diagnosability effectiveness.

Pd0=the probability of diagnosing to a single latch given that the SRL is stuck-at-0

Pd1=same as above but for the SRL stuck-at-1

One can then approximate the total diagnostic probability for a course measure for a design as:

$$Pd \simeq \frac{Pd0 + Pd1}{2}$$

Although we have been discussing the use of this concept from a low or zero yield perspective, it is also applicable to any scan fail situation.

While discussed in reference to chips, this can be extended to modules, systems, macros, and cores, and accordingly, across this range, the methods for self testing applies to a broad group of manufacturing and development activities. On the low end of the VLSI design, the methods can be used by most logic chip designers and foundries. Alternatively, on the high end system design, the methods can be the basis for system level self test. Especially developers and manufacturers that utilize LSSD, scan designs, and other structural test methodologies can greatly benefit from this design, and the VLSI test system designers and manufacturers supplying hardware and software to test these products can benefit from these methods by simplifying the test system and reducing its cost.

The described process can be employed with Built In Self Test with memory storage of the patterns, so that built in diagnostics are integrated with BIST. BIST is a process used by IBM and illustrated by the self test system of U.S. Pat. No. 5,764,655: "Built in Self Test with Memory," granted Jun. 9, 1998. There are an integrated circuit chip and an electronic system disclosed, each incorporating a self-test system. The integrated circuit chip includes capability for Built In Self Test (BIST) and a non-volatile memory where the BIST may be self-programmable. The electronic system comprises an integrated circuit chip which includes on the chip Built In Self Test (BIST) and a non-volatile memory, together with an off-chip test target.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for testing and diagnosing broken or stuck-at scan chains in an integrated circuit to locate failed or failing shift registers after application of a predetermined set of test patterns to be used for a set of chips, comprising the steps of:

(a) generating a set of diagnostic patterns which will be used to identify a failing SRL for a set of chips that are to be diagnosed;

(b) using said set of diagnostic patterns to diagnose chips that have broken scan chains by using a set of diagnostic patterns in a predetermined order;

(c) the patterns are examined and a determination is made as to the failing SRL which is identified for each chip being diagnosed, said failing SRL providing a precise location for physical failure analysis; and then (d) a physical failure analysis is performed to enable process improvements to be made in the technology used during chip manufacturing after understanding the reasons for failures identified during the diagnosis of the chips tested by steps (a) through (c) to make yield improvements to ensure successful production of the chip design with improved yields.

2. A method according to claim 1 wherein the scan is of a partial design.

3. A method according to claim 1 wherein the scan analysis is extended hierarchically to larger system elements, from a partial chip level, to a chip level, to a module level, and to a system level.

4. A method according to claim 1 wherein the scan analysis is run using a pattern stored in built-in self test (BIST) memory associated with the logic having latches being tested.

5. A method according to claim 1 wherein the testing employs look ahead patterns which are generated using a deterministic scan pattern for each RML latch instance, such that for each scan fail state for the RML latch the scan fail state complement is equal to the scan fail state for said RML latch instance which is equal to the representative stim latch instance for all registers that cannot be stimmed and scan out registers that cannot be observed.

6. A method according to claim 1 wherein the testing is used within the latch composition.

* * * * *